United States Patent [19]

Schock

[11] Patent Number: 4,802,929
[45] Date of Patent: Feb. 7, 1989

[54] COMPLIANT THERMOELECTRIC CONVERTER

[75] Inventor: Alfred Schock, Bethesda, Md.

[73] Assignee: Fairchild Industries, Inc., Chantilly, Va.

[21] Appl. No.: 943,795

[22] Filed: Dec. 19, 1986

[51] Int. Cl.$^4$ ............................................. H01L 35/04
[52] U.S. Cl. ..................................... 136/205; 136/202; 136/212; 136/292
[58] Field of Search ............... 136/200, 202, 203, 204, 136/205, 211, 212, 292; 310/306

[56] References Cited

U.S. PATENT DOCUMENTS

| | | | |
|---|---|---|---|
| 3,208,877 | 9/1965 | Merry | 136/212 |
| 3,269,874 | 8/1966 | Moeller | 136/211 |
| 3,325,312 | 6/1967 | Sonntag | 136/212 |
| 3,607,444 | 9/1971 | DeBucs | 136/211 |
| 3,833,428 | 9/1974 | Snyder et al. | 136/202 |
| 3,931,532 | 1/1976 | Byrd | 136/202 |
| 3,989,547 | 11/1976 | Purdy et al. | 136/202 |
| 4,204,882 | 5/1980 | Howell | 136/202 |
| 4,497,973 | 2/1985 | Heath et al. | |

*Primary Examiner*—Charles T. Jordan
*Assistant Examiner*—John W. Eldred
*Attorney, Agent, or Firm*—Michael W. York

[57] ABSTRACT

The present invention provides a thermoelectric converter including a series of thermoelectric cells bonded to a hot surface and to a waste heat conductor. The heat conductor is in turn bonded to cooling pipes which have corrugations to prevent the build up of thermal stresses in one direction. Thermal stress is avoided in a second direction, perpendicular to the first, by having spaces located between the thermoelectric cells. The converter can be folded into a compact configuration and is applicable to satellite power systems.

10 Claims, 4 Drawing Sheets

COMPLIANT THERMOELECTRIC CONVERTER

BACKGROUND OF THE INVENTION

Space systems for anticipated missions will have very high power requirements due to their complexity and size. For instance, one reactor power system that is being considered would employ thermoelectric converters producing a total of 300 electrical kilowatts. This is three orders of magnitude above the power level of thermoelectric generators used in space thus far.

To help reduce the size, weight and cost of such large thermoelectric power systems, it is advantageous to concentrate the many thermoelectric elements in a relatively small number of rather large thermoelectric converter assemblies, if this can be done without sacrificing reliability. However, in previously proposed thermoelectric converter assembly designs, the end faces of the thermoelectric elements are bonded to rigid hot and cold plates. The principal problem with such design is the large differential thermal expansion of the hot and cold plates due to their large temperature difference, which typically is on the order of 500° K.. If we assume that the plates are made of niobium, this temperature difference produces an expansion mismatch of some of 0.5%. This mismatch, extending over the entire assembly length and width, would produce destructive shear stresses and tensile stresses in the relatively fragile thermoelectric legs and the many interface bond within each cell. To avoid such destructive stresses, compliant elements to accommodate the expansion mismatch must be provided or some other way found to accommodate the shear and tensile stresses resulting from expansion and contraction due to temperature differences.

A thermoelectric converter is usually made up of large number of small, electrically interconnected thermoelectric cells. In the past it has been proposed that the problem of accommodating the large shear and tensile stresses resulting from expansion and contraction due to temperature difference between the hot and cold panels be solved by inserting a compliant pad between each thermoelectric cell and its adjoining hot and/or cold plate. It was proposed that such a compliant pad be made from an array of flexible graphite or metal fibers bonded to two face plates. Such compliant pads could accommodate the thermal expansion differences within each cell, but it is very doubtful that such pads could accommodate the much larger cumulative mismatch between large hotplates and coldplates extending over the entire converter assemblies. Moreover, such fiber pads would also produce substantial temperature drops, which would result in a significant reduction in thermoelectric power and conversion efficiency.

The invention overcomes the thermal stress problems associated with large-scale thermoelectric converters and does not require large non-productive temperature drops or reduced thermoelectric power and conversion efficiency. In addition the invention does not require modification of the individual unit thermoelectric cell such as by the addition of a compliant pad.

SUMMARY OF THE INVENTION

This invention relates to thermoelectric converters and more particularly to thermoelectric converters that can be used at high temperatures.

It is also an object of the invention to provide a thermoelectric converter assembly that can accommodate large temperature differences between its hot and cold ends.

It is an object of the invention to avoid destructive thermal stresses and strains in thermoelectric cells due to cumulative thermal expansion mismatches in large converters.

It is the object of the invention to provide a thermoelectric converter that is highly efficient.

It is an object of the invention to provide a thermoelectric converter that does not have large nonproductive temperature drops.

It is also an object of the invention to provide a design that makes possible large converter panels without destructive thermal stresses.

It is the object of the invention to provide a thermoelectric converter that does not have any unwanted reduction in its thermoelectric power and conversion efficiency.

It is the object of the invention to provide a thermoelectric converter that utilizes standard unmodified thermoelectric converter cells.

It is also an object of the invention to provide a thermoelectric converter that does not require thermoelectric converter cells with compliant pads.

It is also an object of the invention to provide a thermoelectric converter that avoids the buildup of cumulative thermal expansion mismatches.

It is also an object of the invention to provide a thermoelectric converter that is highly reliable.

It is also an object of the invention to provide a thermoelectric converter that is easy to manufacture.

The present invention provides a thermoelectric converter including a series of operatively interconnected thermoelectric cells, and means associated with the thermoelectric cell assemblies for accommodating expansion mismatches due to temperature differences within the assembly. The temperature-accommodating means includes means for accommodating thermal expansion in a first direction and also means for accommodating thermal expansion in a second direction that is substantially perpendicular to the first direction of thermal expansion.

BRIEF DESCRIPTION OF THE DRAWINGS

The invention will be herinafter more fully described and its context in the overall power system explained by reference to the accompanying drawings, in which:

FIG. 2B also depicts the lithium lines' foldable hinged joint, which enable the radiator panels to be folded into a compact configuration for stowage during launch;

DETAILED DESCRIPTION OF THE PREFERRED EMBODIMENT

Figure 1:
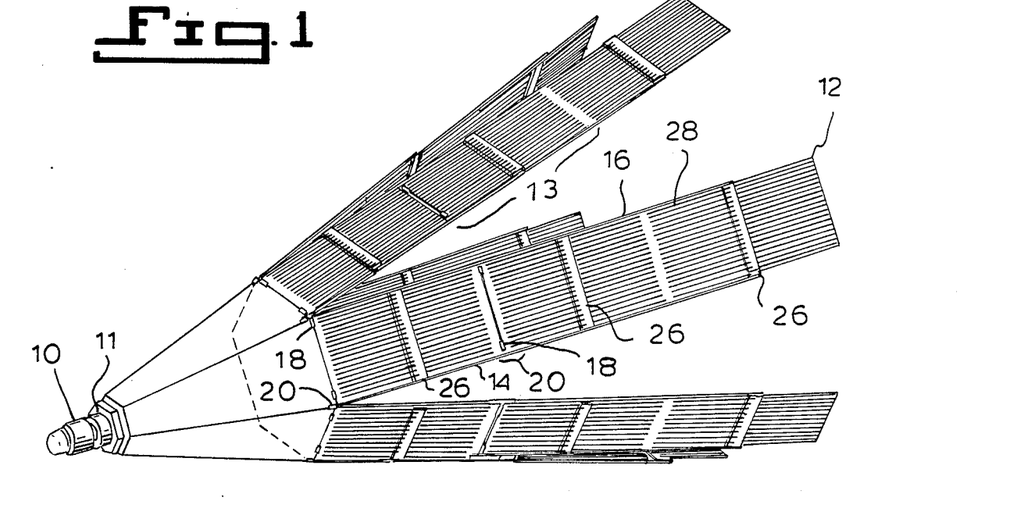
FIG. 1 is an isometric overview of the overall power system, showing the reactor heat source and six identical radiator/converter panels, each of which consists of three essentially identical segments.

FIG. 1 shows a perspective overview of a 300-kw(e) space power systems in its deployed (post-launch) configuration. At its apex is a 7-Mw(t) nuclear reactor 10 and shield 11. The reactor heats a lithium stream to a temperature of approximately 1400° K. The hot lithium is delivered to six identical converter/radiator panels 12 of approximately 2.1 m by 13 m each. Each panel contains three thermoelectric converters 26, each of which is cooled by two sets of radiator heat pipes 28. A lithium feed line 14 is at one edge of each panel, and a lithium return line 16 is at its opposite edge. Hinges 18 and corrugated lithium pipe segments 20 make it possible to fold the radiator panels into a compact launch configuration which fits within 60% of the shuttle's payload bay.

Figure 2A:
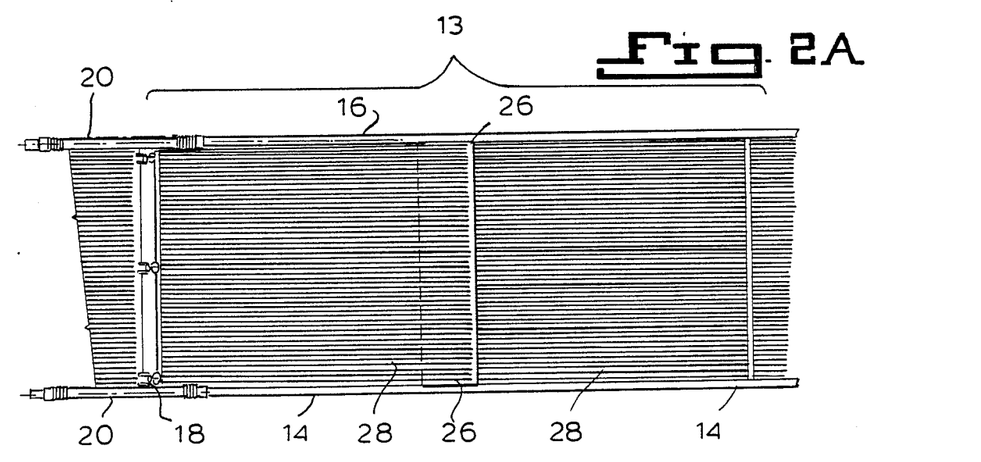
FIGS. 2A and 2B show a face view and edge view of a typical panel segment, consisting of lithium feed and return lines connected by a centrally located thermoelectric converter cooled by two sets of radiator heat pipes.
Figure 2B:
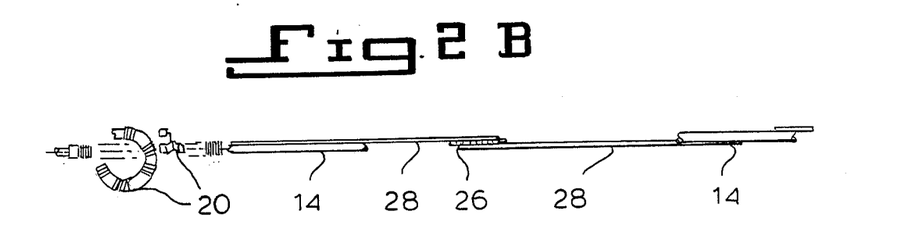

As indicated in FIG. 1, each of the six radiator panels 12 consists of three essentially identical segments. FIGS. 2A and 2B show a plan view and edge view of one such segment 13, specifically the middle one. The figure shows the lithium feed line 14 and return line 16 at the panel's edges, as well as the hinge 18 and folding lithium pipe joint 20. At the center of the radiator segment is a thermoelectric converter 26 which spans the full panel width. As shown in FIG. 2B, the two faces of the rectangular converter 26 are cooled by heat pipes 28, each of which extends over one half the length of the radiator segment. With this arrangement, all radiator heat pipes 28 have the same 7-foot length and the same spacing from their neighbors. The heat pipes operate at about 800° K. and employ a potassium working fluid.

Figure 3:
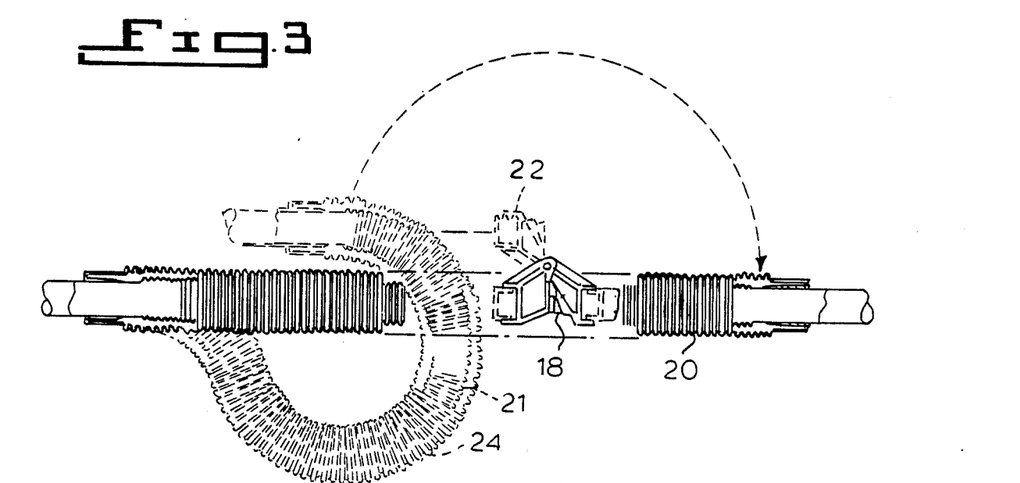
FIG. 3 is an enlarged view of a portion of the structure illustrated in FIG. 2B.

FIG. 3 shows a close-up view of the radiator hinge and the foldable lithium pipe joint. The solid lines shown the hinge 18 and joint 20 in their deployed configuration, and the phantom lines show the hinge 22 and pipe joint 22 in their stowed configuration. The figure also illustrates the option of using redundant coaxial lithium ducts 21 for enhanced reliability.

Figure 4A:
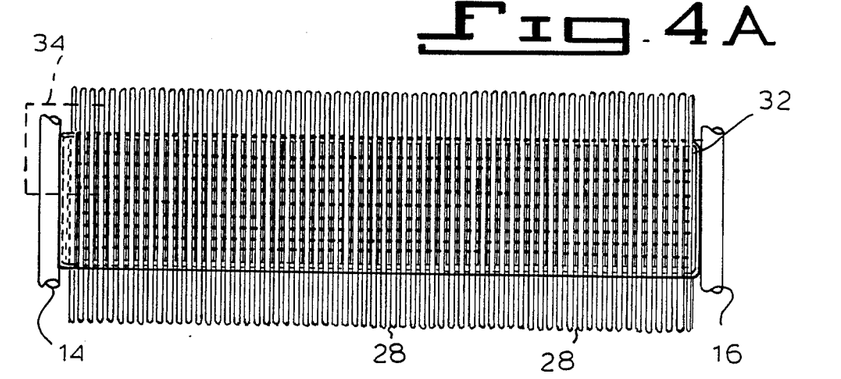
FIGS. 4A, 4B, and 4C show a face view, edge view, and end view of a thermoelectric converter, including segments of the adjoining lithium lines and radiator heat pipes.
Figures 4B, 4C:
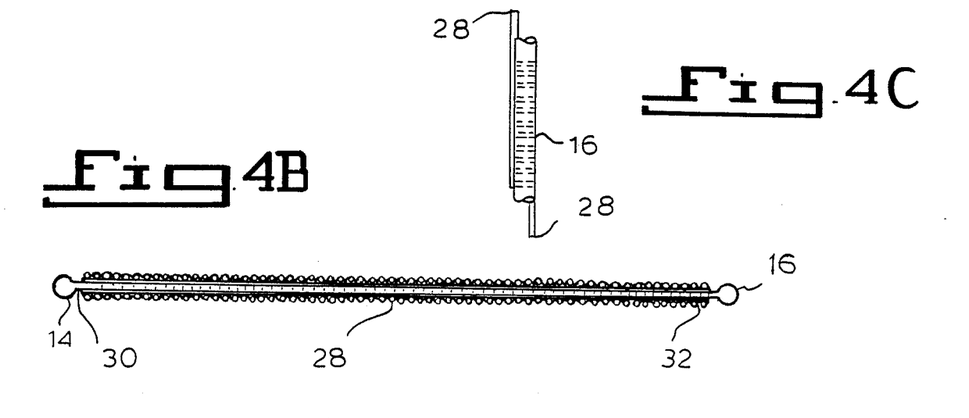

The thermoplastic converter 26 shown in FIGS. 2A and 2B is depicted in greater detail in FIGS. 4A, 4B, and 4C. Respectively, these present a plan view, edge view, and end view of the converter 26 and of sections of the adjoining lithium pipes 14, 16 and radiator heat pipes 28. As shown in FIG. 4B, a thin lithium duct 30 connects the lithium feed line 14 and return line 16. The upper and lower surfaces of the duct 30 act as hotplates to which the thermoelectric cells 32 are bonded. There are 640 cells on each face of the lithium duct 30. These a thermoelectric cells 32, in groups of ten, are bonded to the evaporator sections of the radiator heat pipes 28.

Figure 5:
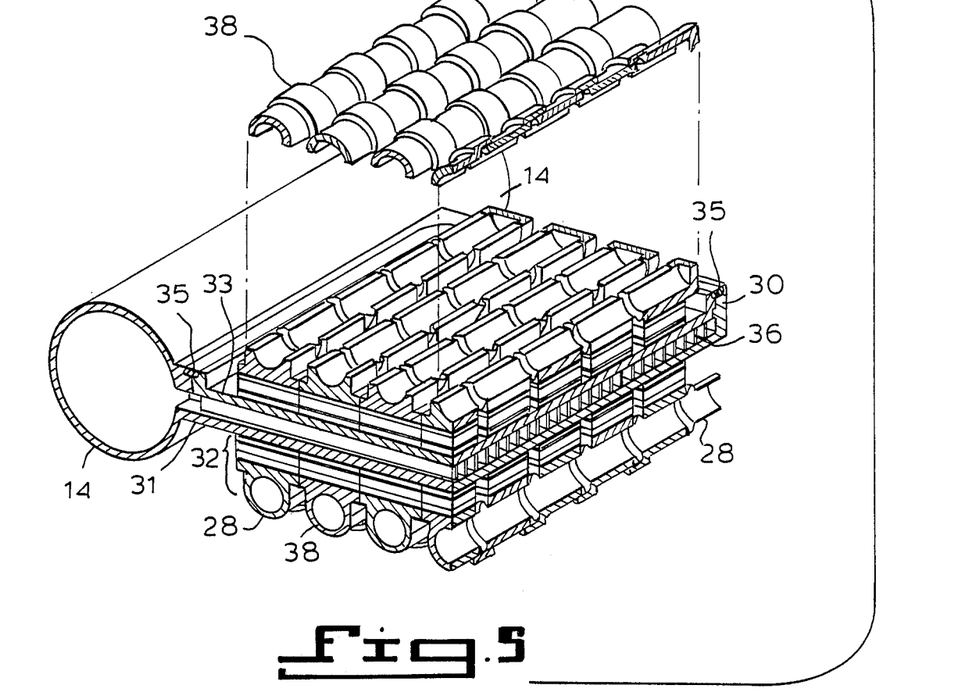
FIG. 5 is an enlarged exploded isometric view of a portion of the structure set forth within the dashed line portion of Figure 4A.

The corner of the converter enclosed by the dashed rectangle 34 in FIG. 4 is shown in close-up in the cutaway perspective view of FIG. 5. The figure shows part of the lithium feed line 14 and lithium duct 30, and an array of 3.5 by 4.5 thermoelectric cells 32 on each face of that duct. As can be seen, the lithium duct 30 has integral internal fins 36, for improved heat transfer and structural stability.

FIG. 5 also shows evaporator sections of the radiator heat pipes 28. The upper heat pipes have been exploded at their midplane, to display details of their geometry. The figure also depicts armor elements 38 to protect the heat pipes 28 against micrometeorite impacts.

Figures 6, 7B:
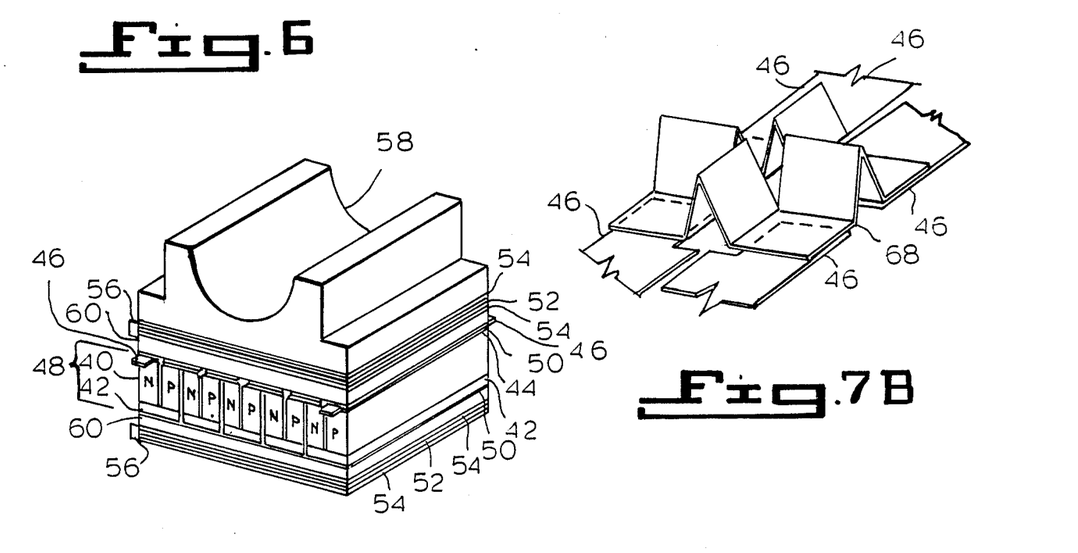
FIG. 6 displays an isometric close-up of one of the thermoelectric cells, showing its thermoelectric legs, connected in series by alternating hot straps and cold straps to form a multicouple.
FIG. 7B is an enlarged view of a portion of the structure set forth in FIG. 7A taken within the circle 7B thereof.
Figure 7A:
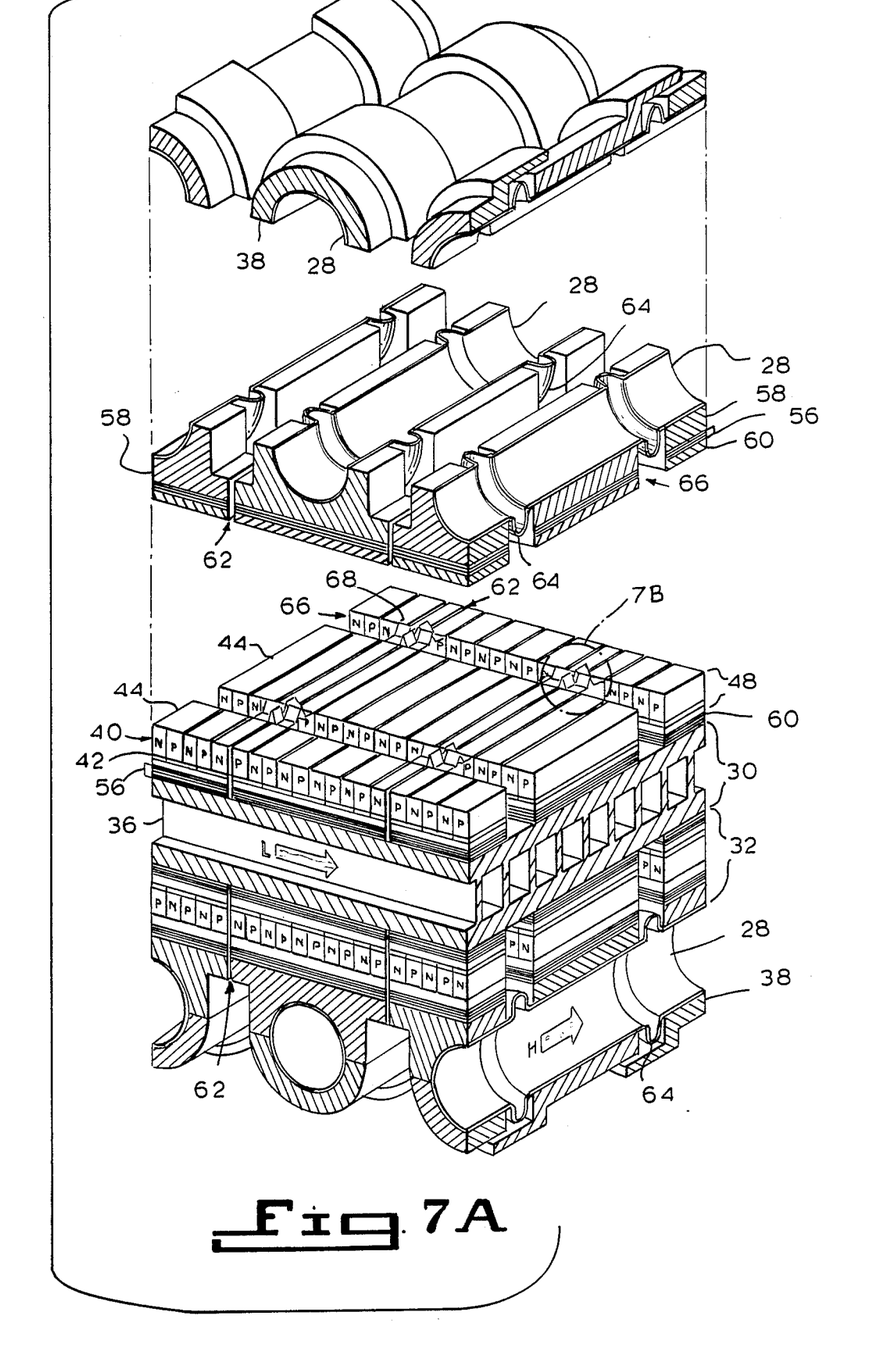
FIG. 7A shows an exploded close-up view of a typical thermoelectric cell and of sections of its nearest neighbors.

FIG. 5 also illustrates the basic schemes for preventing the buildup of cumulative thermal stresses in the converter 26 due to temperature differences between its hot lithium duct 30 and its much cooler radiator heat pipes 28. However, the explanation of how these schemes work will be deferred to the discussion of FIG. 7, which illustrates them more clearly.

One of the thermoelectric cells 32 shown in Figure 5 is depicted more clearly in the perspective view of FIG. 6. As the cell's midplane is an array of ten thermoelectric legs 40, specifically five n-legs alternating with five p-legs. Most of the temperature drop in the converter occurs in those legs. The slab-like legs are made of a silicon-germanium solid solution, with or without a gallium phosphide additive. In addition, phosphorus or boron dopant is added to produce the n-legs or p-legs, respectively.

There are five pairs of glass-bonded n- and p-legs 40 in the cell. The two legs in each pair are electrically connected by means of hot-strap 42 bonded to their hot ends. The hot-straps 42 are made of a silicon-molybdenum mixture. Each set of one n-leg, one p-leg and one hot-strap constitutes one unicouple.

The five unicouples in the cell are electrically series-connected by means of six staggered tungsten cold-straps 44. The first and last of the six-cold-straps extend beyond the front and rear faces of the thermoelectric cell. The projecting tabs 46 are the cell's terminals, which are used to make series and parallel connections between adjacent cells in the converter. The assembly of thermoelectric legs 40, hot-straps 42, cold-straps 44, and tabs 46 is referred to as a multicouple 48.

FIG. 6 also depicts thin (2-mil) glass layers 50 which electrically isolate the thermoelectric legs 40 (and hot-straps 42) from each other, and which electrically isolate but thermally connect the multicouple to the cell's end sections.

The principal function of the cell's end sections is to provide additional electrical isolation between the multicouple and the converter's grounded lithium duct 30 and radiator heat pipes 28. The thin glass layers 50 mentioned above are adequate to resist the voltage differences developed within a single thermoelectric cell. But they are not adequate to resist the much higher voltages developed by the whole converter and by the total power system. To resist those higher voltages, thicker (20-mil) ceramic layers 52 (e.g., alumina) are interposed between the multicouple and the converter's hot and cold structures.

FIG. 6 assumes that each of the alumina ceramic layers 52 is sandwiched between two layers of niobium 54. This sandwich is referred to as a trilayer 56. Niobium and alumina have closely matched thermal expansion coefficients. The niobium layers 54 have two functions: they provide structural support for the less ductile alumina 52, and they provide lateral thermal conductance, to reduce the effects of any bond imperfections which may occur. As shown in FIG. 6, identical trilayers 56 are used at the cell's hot end and cold end. The cold-end trilayer is followed by a beryllium saddle 58, which serves as a thermal bridge to the adjoining heat pipe 28.

The thermal expansion coefficients of the multicouple's 48 thermoelectric legs 40, hot-straps 42, cold-straps 46, and glass layers 50 are very similar, but they differ significantly from those of niobium 54 and alumina 52 in the trilayer 56. To accommodate that difference, transition layers 60 are interposed between the multicouples 48 and the two trilayers 56. These transition layers 60 consists of low-modulus solid-graphite slabs. These can accommodate thermal expansion mismatches within one thermoelectric cell 32, but they are not adequate to accommodate the cumulative expansion mismatches generated by the whole converter 26. The schemes for accommodating those cumulative mismatches are key features of this invention and are illustrated in FIGS. 7A and 7B.

FIG. 7A shows an exploded perspective view of one thermoelectric cell 32 and parts of its nearest neighbors, above and below the lithium duct 40. The figure is exploded just above the upper cold-straps 44, to depict the series and parallel connections between neighboring multicouples 48; and is exploded at the midplane of the upper heat pipes 28, to display details of the heat pipe's geometry and its anti-meteorite armor elements 38.

The principal purpose of FIGS. 7A and 7B is to illustrate the basic schemes for preventing the buildup of cumulative thermal stresses in the thermoelectric converter 26, caused by temperature differences between the converter's lithium duct 30 and radiator heat pipes 28. These schemes must compensate for thermal expansion differences in the direction parallel to the lithium flow (indicated by the arrow L) and in the direction parallel to the heat pipe vapor flow (indicated by the arrow H). Two different schemes are used for these two purposes in the illustrated converter design.

Differential expansion in the direction parallel to the lithium flow (L) is accommodated by leaving small (10-mil) gaps 62 between adjacent thermoelectric cells 32, and by omitting any structural connections between adjacent heat pipes 28 in the vicinity of the converter 26. Thus, the higher thermal growth of the lithium duct 30 in that direction merely increases the width of the intercell gaps 62 and the spacing between heat pipes 28, without inducing any cumulative expansion stresses in the relatively fragile thermoelectric cells 32.

Differential expansion in the direction parallel to the heat pipe vapor flow (H) is accommodated by providing each heat pipe 28 with a single corrugation 64 between neighboring thermoelectric cells 32. To provide room for these corrugations, a rather wide (0.25-inch) gap 66 is required between neighboring columns of cells. With this arrangement, differential thermal growth in the converter is not cumulative. The differential thermal expansion per cell column is only 0.006 inch, which can be accommodated by the compliant corrugation 64 with only minor axial loads.

FIG. 7A does not show the heat pipe wick and/or artery which returns the potassium condensate to the evaporator. Such a wick or artery would also have to be axially compliant. This can be done by making the wick and/or artery out of screening cut at a 45 degree bias.

As shown in FIGS. 4A and 4C, each heat pipe 28 contacts ten thermoelectric cells 32. Therefore, nine or ten corrugations 64 are required in each heat pipe wall. These are all in the heat pipe's 1 foot-long evaporator section. No corrugations are needed in its much longer condenser section.

The illustrated converter design is based on a rigid hot structure and a compliant cold structure. This is the preferred embodiment, but the invention would also embrace the use of a compliant hot structure and a rigid cold structure; or the use of some compliance in both structures.

As discussed above, the illustrative design employs two different schemes for accommodating differential expansion in the two directions. It should be emphasized that this illustrates the preferred embodiment of the invention, but that other embodiments would also satisfy the basic invention. Either scheme could be used in both directions. For example, the need for corrugations could be eliminated by employing discrete lithium ducts perpendicular to the discrete heat pipes.

Finally, the compliance schemes illustrated in FIG. 7A also require compliancy in the electrical connectors between neighboring cells. Such connectors 68 are depicted at the four corners of the central multicouple in FIG. 7A, and the circled connector is shown in greater detail in the enlarged close-up in FIG. 7B.

As seen, the connector 68 derives its compliancy from the use of a folded-foil configuration. The connectors are located at the intersections of perpendicular intercell gaps 62 and 66, and each connector is spot-welded to the terminal tabs 46 of four adjacent multicouples 48. As shown, each connector 68 serves both as a series connector (from left to right) and as a parallel connector (from front to back). The provision of two series connections 68 at each of multicouple 48, and the use of five parallel strings with cross-connections after each multicouple, greatly enhance the converter's circuit reliability.

The thermoelectric converter 26 is manufactured and used in the following manner. The description of the construction starts with the thermoelectric cell 32, which is the basic element that converts heat into electricity. The fabrication starts with the preparation of n-doped and p-doped SiGe/GaP or SiGe blocks, from which n- and p-type slices are cut. These slices have the same thickness as the desired n- and p-legs, typically about 0.1 inch. Note that the n- and p-slices need not have the same thickness. In general, their optimum thickness ratio depends on the physical properties of the thermoelectric materials. The exact dimensions can be determined by detailed design optimizations and thermal-stress analyses known in the art.

Each n-slice is glass-bonded to a mating p-slice, and the resulting n-p sandwich is then cross-sliced to produced bonded pairs of n- and p-legs 40 with the desired leg length (0.15"). One edge of each leg pair is then germanium-bonded to a SiMo hot strap 42, which serves as the electrical connector between the unicouple's legs. SiMo was selected as the material for the hot-strap 42, because it matches the thermal expansion coefficient of the thermoelectric legs 40, and because of its long-term compatibility with Si-Ge and SiGe/GaP legs at the desired hot-junction temperature (1000° C.). The hot straps 42 are typically 0.040-inch thick. The optimum thickness must be determined by detailed two-dimensional electrical and thermal analyses, since very thin hot straps can lead to excessive voltage drops, and very thick hot-straps can lead to excessive temperature drops.

During bonding the germanium diffuses into the SiGe/GaP legs 40 ad SiMo hot straps 42 to form a silicon-germanium alloy. Care must be taken to avoid the retention of excess free germanium, which can lead to power-dissipating shorts between adjacent unicouples. To avoid this, only a very thin coating of germanium is applied, e.g. by sputtering. (In this case of SiGe legs, which can tolerate very high bonding temperatures, the germanium layer can be eliminated by using a high-temperature diffusion bond between the legs and hot-straps).

A number of unicouples 40, 42, 40 are joined together to form a typical multicouple 48. The number of unicouples per multicouple is determined by a combined thermal, thermoelectic and electrical system optimization analysis using techniques known in the art. The multicouple fabrication sequence starts by lapping and glass-coating the sides of the unicouples (legs 40 and hot straps 42) and by glass-bonding them together to form a unicouple assemby. This procedure is much superior to the previous practice of first glass-bonding all of the thermoelectric legs together, then germanium-bonding the five discrete hot straps to the ends of the leg pairs, and then filling in the gaps between hot straps with additional glass insulation. The preferred scheme produces much better hot-strap alignment with the legs and results in more uniform thickness of glass insulation.

After the unicouple assembly is formed, tungsten colds straps 44 are brazed to the cold ends of the thermoelectric legs to form the series connections between unicouples. Tungsten matches the thermal expansion coefficient of the SiGe/GaP legs. Since it is an excellent conductor, only very thin cold straps 44 (e.g. 1 mil) are required.

One method of applying the tungsten cold-straps is to utilize a single tungsten foil, slotted to form the desired cold straps but with connectors temporarily left in the place to hold the cold straps together. After the slotted tungsten foil is brazed to the unicouple assembly by means of a high-temperature braze alloy, the connectors and any extruded braze alloy are milled away to break the contact between adjacent cold straps.

One important advantage of this fabrication method is that it permits the provision of projecting tabs 46 at the four corners of the thermoelectric cell 32, as depicted in Figure 6. As shown in FIGS. 7A and 7B, these corner tabs are very useful for making redundant series and parallel connections between neighboring thermoelectric cells 32.

In addition to the multicouple 48, each thermoelectric cell 32 contains end sections consisting of electrical insulators 52, stress-relieving transitions 60, and a thermal conductor 54, 58. In the preferred embodiment, these end sections are fabricated as separate subassemblies.

As shown in FIG. 6, the thermoelectric hot straps 42 and cold straps 44 are electrically isolated from the adjoining transition layers 60 by thin glass bonds 50. These glass bonds are adequate to withstand the low voltage generated within one cell 32, but not the much higher voltages between the circuit and ground. To withstand these, one requires a thicker high-voltage insulator which is also a good thermal conductor. In the preferred embodiment, a 10- to 20-mil layer of alumina 52 has been used for this function, and the high-voltage isulator 52 is part of a bonded trilayer sandwich 56 consisting of niobium 54, alumina 52, and niobium 54. The use of a trilayer structure can minimize the stresses in the more fragile ceramic. The alumina 52 may be present either as a pure ceramic, or as a uniform cermet, or as a graded cermet whose composition changes gradually from metal to ceramic and back to metal.

Each thermoelectric cell 32 contains such a trilayer insulating sandwich 56 at its hot face and cold face. Niobium and alumina have thermal expansion coefficients of approximately $8 \times 10^{-6}$, compared to the $5 \times 10^{-6}$ expansion coefficients of the SiGe/GaP legs 40, the SiMo hot straps 42, and the W cold straps 44 which comprise the multicouple 48. Consequently, even though the cell 32 is much smaller than the converter 26, a small amount of compliance is still needed to compensate for the difference in expansion coefficients within the cell 32. Therefore, a 0.060"-thick transition layer 60 of solid graphite is interposed between each face of the multicouple and the neighboring trilayer 56. This graphite transition layer would to be adequate if the thermoelectric cells were subjected to cumulative stresses due to the differential thermal expansion of a non-compliant converter structure 26.

Each trilayer insulator sandwich 56 is bonded to a graphite transition wafer 60 to form identical subassemblies for the hot and cold faces of the thermoelectric cell 32. One of these subassemblies is used "as is" for the hot end, but the cold-end subassembly is first brazed to a beryllium saddle 58. These saddles serve as the thermal conductors between the thermoelectric cells 32 and the radiator heat pipes 28. The hot-end and cold-end subassemblies are then glass-bonded to the multicouple 48 to form the completed thermoelectric cell 32.

The thermoelectric cell depicted in FIG. 6 is then subjected to final inspection and electical performance tests, both cold and in-gradient. It will be noted that the ends of the thermoelectric legs 40 and those of the hot straps 42 and cold straps 44 are still exposed for voltage probing at this point. To avoid subsequent risk of inadvertent shorts in the converter module 26, an insulating glass coating is then applied. This completely covers the four sides of the cell 32, except for the projecting cold-strap tabs 46 at the four corners, which are used for intercell electrical connections. The cells 32 are then ready for brazing to the two faces of the converter's lithium duct 30.

The converter's hot structure or hotplate, which is located at the midplane of the converter 26, has lithium inlet 14 and outlet 16 headers connected by a thin flat duct 30 with integral internal fins. The reliability of the lithium enclosure or hotplate in the preferred embodiment is maximized by three means; by using weld joints instead of braze joints wherever hermeticity is required; by reducing the number of weld joints to a minimum; and by backing up those weld joints with independent weld covers.

The number of citical welds in the hotplate is minimized by making the entire hot structure, including the lithium headers 14, 16 and the connecting duct 30, from just two machined parts. One machined part consists of the two lithium pipes 14, 16 and the connecting duct's lower face plate 31, and the second part consists of the duct's upper face plate 33. (See FIG. 5.) Each face plate has a set of integral fins 36, and the two sets of fins interleaf. For each plate 31, 33, the grooves between fins are machined out by milling. In the case of the lower plate 31, the final passage of the grooves into the two lithium pipes 14, 16 can be made by electric-discharge machining.

As shown in FIG. 5, the two plates are shallow rectangular trays with rounded corners, with the upper tray 33 designed to nest inside the lower 31. Thus, final closure of the hotplate's lithium enclosure can be made by a simple single-pass electron-beam weld around the circumference of the upper tray 33.

Instead of first completing the fabrication of the hotplate 30 as illustrated in FIG. 5 and then brazing the previously described thermoelectric cells 32 to the hotplate's two faces, in the preferred fabrication method this sequence is reversed; i.e., the cells 32 are first brazed to the two hotplate halves 31, 33 before the two halves are welded to each other. The reason for the recommended fabrication sequence is to permit inspection of those critical braze joints, which form the thermal bond between the cells 32 and the hotplate 30. If the thermoelectric cells 32 were brazed to the previously completed hotplate 30, the resultant braze joints would have rather poor inspectability. With the recommended procedure, the braze joints can be inspected from the inner face of each half 31, 33 of the hotplate, e.g. by ultrasonic inspection or by thermal tests. If necessary, corrective action can then be taken on any defective braze joints.

After the thermoelectric cells 32 have been brazed to the two hotplate halves 31, 33 and the bond integrity has been verified, the two halves are electron-beam-weld to each other. The primary weld joint is then leak checked and inspected, and covered with the rim-shaped weld cover 35 shown in FIG. 5, for enhanced reliability. The weld cover 35 serves as a redundant backup to the primary weld joining the duct's 30 upper 33 and lower 31 halves. It very much increases the duct's 30 lithium containment reliability.

After the thermoelectric cells 32 are bonded to the converter's lithium duct 30, series and parallel connections 68 are made between the converter's cells 32 in the previously indicated manner. As shown in FIG. 7A, the series-connected strings of cells 32 run between left and right, which is the principal curret flow direction L in the converter 26. Parallel connections between cells extend from front to back. Normally there is no significant current flow in the direction H.

As indicated in FIGS. 7A and 7B, at each intersection of gaps 62 and 66 within the array, the previously described corner tabs 46 of the neighboring four cells 32 are connected together by means of a spot-welded connector 68. As can be seen, the corner connectors serve as both the series and parallel connections. Note that each end of each cell is connected to its neighbors by two independent connectors. This redundancy greatly enhances circuit reliability.

It is apparent that the electrical connectors 68 must themselves be compliant to avoid thermal stresses in the cells 32. Although the connectors 68 are made of rather thin (1 or 2 mil) metal foils, additional compliance is provided by using the folded-foil configuration shown in FIG. 7B. The folded foil is very flexible, and the configuration shown in highly compliant in both directions L and H.

Each thermoelectric cell 32 contains an integral saddle 58, and the corrugated evaporator sections of the discrete ratiator heat pipes 28 are brazed to those saddles, one heat pipe for each row of ten thermoelectric cells. Thus each saddle 58 serves to conduct the waste heat from its multicouple 48 to a radiator heat pipe 28, which distributes that heat over the length of the radiator segment 13.

As previously indicated, compliance in the lateral direction H, normal to the heat pipe axes, is provided by the small gaps 62 (e.g., 10 mils wide) separating adjacent cells 32. Thus, thermal growth of the hotplate 30 in that direction merely increases the size of those gaps 62 by 5 mils, without inducing any cumulative stresses in the cells 32. Compliance in the direction H parallel to the heat pipe axes is provided by a single heat pipe corrugation 64 in each gap 66 between neighboring columns of cells. Each corrugation 64 can compensate for the differential axial growth of the converter 26 without excessive axial loads or shear stresses in the thermoelectric cells 32.

The compliant corrugation 64 are only needed over the 1-foot length of each heat pipe evaporator that is bonded to the saddles 58 of the thermoelectric cells 32. The required corrugations 64, at 1.25-inch intervals, can be hydroformed. Thus, provision of the compliant heat pipe corrugations 64 need not require any additional weld joints.

The 0.25-inch gaps 66 between neighboring columns of thermoelectric cells 32, to provide room for the desired heat pipe corrugations 64, also serve a second purpose. They also provide room for the required electrical connectors 68 between cells 32.

To avoid excessive radiative heat losses in those gaps 66, thermal insulation must be provided between the hotplate 30 and the heat pipe convolutions 64 (and also the electrical connectors 68). The insulation consists of multiple layers of 0.25"-wide strips. Quartz cloth strips are safest, because they are not electrically conductive. Metallic multifoil insulation is more effective, but would require insulating covers (mica or quartz) to prevent inadvertent shorts between the electrical circuit 46, 68 and the grounded hotplate 30.

The anti-meteorite armor 38 is used to protect the relatively thin-walled heat pipes 28. The exposed outer half of each pipe evaporator section is protected by a series of semi-cylindrical armor sleeves 38 made of beryllium. Each sleeve section has a radial step to accommodate the larger O.D. of the heat pipe corrugation 64. Each armor sleeve section is brazed to its heat pipe 28 and cell saddle 58, thus contributing to thermal conduction. It is not joined to the adjacent armor sleeves, since that would interfere with the free movement of the compliant corrugations 64. Since both faces of the thermoelectric converter module 26 are exposed to meteorites, a similar set of armor elements 38 is provided at the other face of the converter module.

When the converter 26 is in operation, liquid lithium flows through the feed line 14, through the converter's lithium duct 30, and through the return line 16. This liquid lithium convectively transports heat from a suitable heat source, such as a nuclear reactor 10, to the converter's 26 hotplates 30. The large surface area of the internally finned 36 lithium duct 30 promotes heat transfer from the liquid lithium to the hotplate 30. The heat is conductively transferred to the thermoelectric cells 32, which convert it into electric power, as illustrated in FIGS. 5 and 7A.

The heat passing through the thermoelectric cell's multicouple 48 generates electrical power in a manner well known to those skilled in the art. (For example, see Thermoelectricity by Heikes and Ure, Interscience Publishers, 1961.) A small fraction of the heat delivered by the lithium stream is converted to electrical power in the thermoelectric cells 32. The balance of heat is then removed by conduction to the radiator heat pipes 28, which employ a potassium or other suitable working fluid. These heat pipes distribute the converter's 26 waste heat over the length of the radiator panels 12. The radiator panels reject this waste heat to space, from both faces.

Although the invention has been described in considerable detail with reference to a certain preferred embodiment, it will be understood that variations or modifications may be made within the spirit and scope of the invention as defined in the appended claims.

What is claimed is:

1. A thermoelectric converter comprising a hot surface, a plurality of thermoelectric cells bonded to said hot surface, said plurality of thermoelectric cells each having a waste heat conductor portion, a plurality of cooling pipes bonded to the waste heat conductor portions of said plurality of thermoelectric cells, and means for preventing the buildup of cumulative thermal stresses due to temperature differences and resultant thermal expansion differences between said hot surface and said cooling pipes, said means for preventing buildup of cumulative thermal stresses comprising means for accommodating differential thermal expansion in a first direction including a plurality of corrugations in said cooling pipes and means for accommodating differential thermal expansion in a second direction substantially perpendicular to said first direction including gaps located between adjacent thermoelectric cells.

2. The thermoelectric converter of claim 1 further comprising electrical interconnecting means connected to said thermoelectric cells for electrically interconnecting said thermoelectric cells, said electrical interconnecting means comprising means for permitting expansion and contraction in a first direction and also in a second direction substantially perpendicular to said first direction.

3. The thermoelectric converter of claim 2 further comprising means operatively associated with said thermoelectric converter for permitting said thermoelectric converter to be folded into a compact configuration.

4. The thermoelectric converter of claim 3 wherein said means for permitting said thermoelectric converter to be folded into a compact configuration comprise bendable corrugated fluid conductor segments.

5. The thermoelectric converter of claim 4 further comprising second bendable corrugated fluid conductor segments located coaxially with said first bendable corrugated fluid conductor segments.

6. The thermoelectric converter of claim 2 further comprising meteorite armor located adjacent said cooling pipes including the corrugations in said cooling pipes.

7. The thermoelectric converter of claim 6 further comprising means located within said thermoelectric cells compensating for differences in expansion coefficients within the thermoelectric cells.

8. The thermoelectric converter of claim 7 wherein said means for compensating for differences in expansion coefficients comprises a graphite layer.

9. The thermoelectric converter of claim 8 further comprising at least one combined high voltage insulator and thermal conductor located within the thermoelectric cells.

10. The thermoelectric converter of claim 9 wherein said combined high voltage insulator and thermal conductor comprises a trilayer structure including niobium and alumina.

* * * * *